United States Patent
Rezvani et al.

(12) 
(10) Patent No.: US 6,392,579 B1
(45) Date of Patent: May 21, 2002

(54) METHOD AND APPARATUS FOR A DAC WITH NON-UNIFORM SAMPLING RATE

(75) Inventors: Behrooz Rezvani, Pleasanton; Dale Smith, Fremont; Sam Heidari, Menlo Park, all of CA (US)

(73) Assignee: Ikanos Communication, Inc., Fremont, CA (US)

( * ) Notice: Subject to any disclaimer, the term of this patent is extended or adjusted under 35 U.S.C. 154(b) by 0 days.

(21) Appl. No.: 09/859,196

(22) Filed: May 14, 2001

Related U.S. Application Data

(60) Provisional application No. 60/203,965, filed on May 12, 2000.

(51) Int. Cl.$^7$ ................................................ H03M 1/66
(52) U.S. Cl. ...................................... 341/152; 341/144
(58) Field of Search ................................ 341/144, 143, 341/152, 123

(56) References Cited

U.S. PATENT DOCUMENTS

| | | | |
|---|---|---|---|
| 5,512,897 A | * | 4/1996 | Wilson ........................ 341/144 |
| 5,600,320 A | | 2/1997 | Wilson et al. .............. 341/144 |

* cited by examiner

*Primary Examiner*—Brian Young
(74) *Attorney, Agent, or Firm*—Charles C. Cary; Cary & Kelly, LLP

(57) ABSTRACT

An apparatus and method is disclosed for a digital-to-analog converter (DAC) system with both uniform and non-uniform sampling rates. The system includes a digital portion in which samples of a set of "N" digital samples are obtained from a digital input stream. Each set of samples is evaluated with various test decimations which may include various combinations of uniform and non-uniform timing intervals between the selected members of each decimation. Each test decimation includes substantially the same number "M" of digital samples where "M" is less than the number of samples "N" in each sample set. Each test decimation is digitally evaluated to determine which is the optimum test decimation. The optimum test decimation exhibits the best fit with the original set of "N" samples using a reduced set of "M" digital samples. This optimum test decimation along with the appropriate timing information is subject to an digital-to-analog conversion, with the corresponding analog output signal retaining a high degree of fidelity with the digital input signal albeit at a reduced average sampling rate. The reduction in sampling rate for the DAC simplifies circuit design and reduces power requirements.

10 Claims, 5 Drawing Sheets

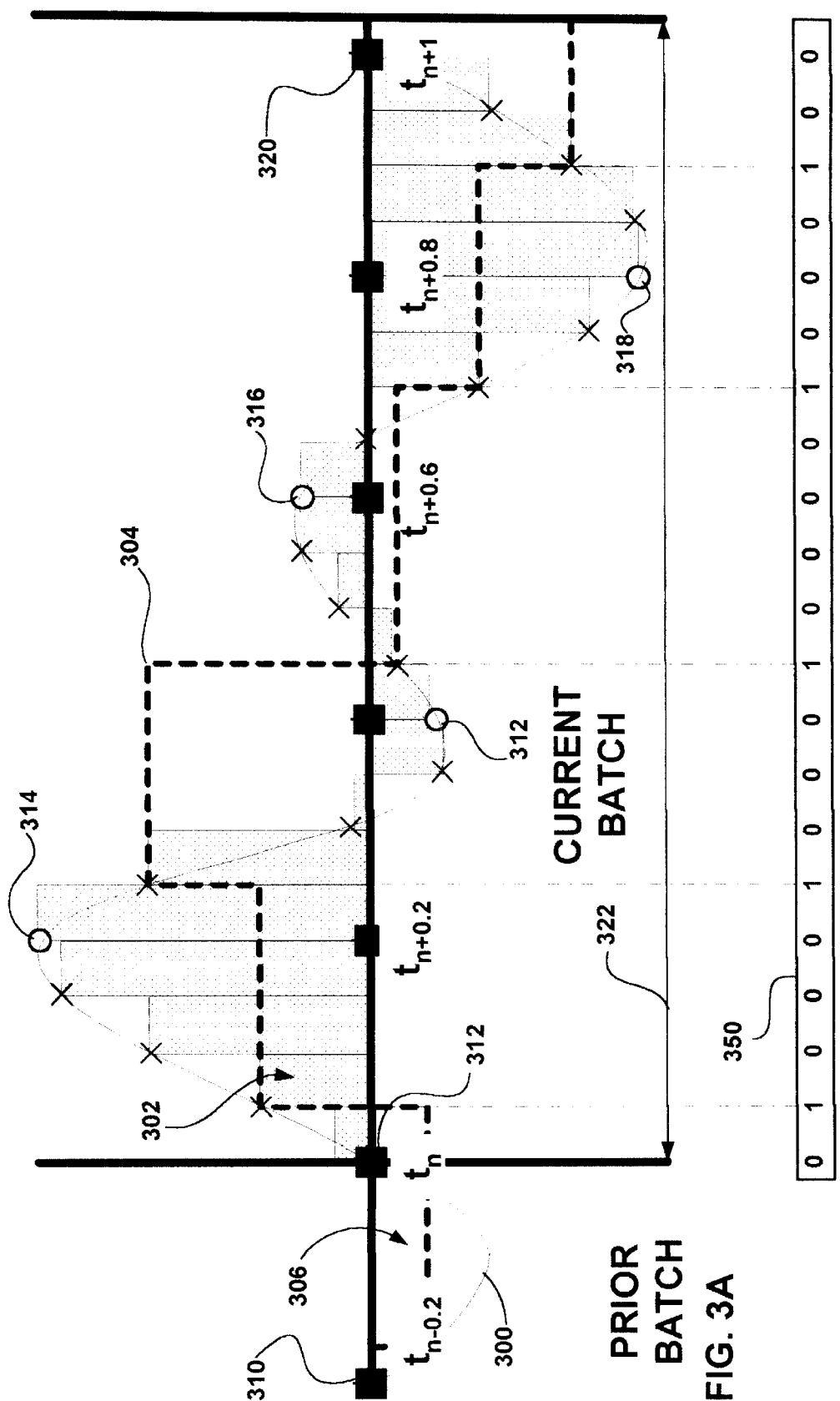

METHOD AND APPARATUS FOR A DAC WITH NON-UNIFORM SAMPLING RATE

CROSS REFERENCE TO RELATED APPLICATION

This application claims the benefit of prior filed co-pending Provisional Application No. 60/203,965 filed on May 12, 2000 entitled "Non-Uniform maximum-likelihood sampling DAC in multi-channel systems" which is incorporated herein by reference in their entirety as if fully set forth herein.

BACKGROUND OF THE INVENTION

1. Field of Invention

The field of the present invention relates in general to methods and apparatus for digital-to-analog conversion and more particularly to a non-uniform sampling rates for digital-to-analog conversion.

2. Description of the Related Art

There are two standard methods for increasing the signal to quantization noise ratio (SQNR) of a digital-to-analog converter (DAC). First, one can increase the bit precision of the DAC. While this is conceptually the most straightforward technique, this complicates the analog circuit design. For large bit precisions, analog non-linearities will dominate performance. Removing these non-linearities, if possible, requires complicated design and calibration procedures. A second standard method for increasing DAC performance is to interpolate the digital signal to a higher sample rate using well-known signal processing techniques, such as those described in "Multirate Digital Signal Processing" by R. Crochiere and L. Rabiner, published by Prentice Hall Inc. 1983 which reference is incorporated herein by reference. Interpolation spreads some of the quantization noise out-of-band relative to the input signal, where it can be removed by a filtering operation at the receiver. The drawback to this second method that the DAC must run at a higher clock rate, thereby requiring more power.

What is needed are ways to improve DAC performance while minimizing analog complexity or minimizing power consumption.

SUMMARY OF THE INVENTION

An apparatus and method is disclosed for a digital-to-analog converter (DAC) system with both uniform and non-uniform sampling rates. The system includes a digital portion in which samples of a set of "N" digital samples are obtained from a digital input stream Each set of samples is evaluated with various test decimations which may include various combinations of uniform and non-uniform timing intervals between the selected members of each decimation. Each test decimation includes substantially the same number "M" of digital samples where "M" is less than the number of samples "N" in each sample set. Each test decimation is digitally evaluated to determine which is the optimum test decimation. The optimum test decimation exhibits the best fit with the original set of "N" samples using a reduced set of "M" digital samples. This optimum test decimation along with the appropriate timing information is subject to an digital-to-analog conversion, with the corresponding analog output signal retaining a high degree of fidelity with the digital input signal albeit at a reduced average sampling rate. The reduction in sampling rate for the DAC simplifies circuit design and reduces power requirements.

In an embodiment of the invention an digital-to-analog converter (DAC) system for converting a digital signal to a converted analog signal is disclosed. The DAC system includes a DAC and a variable decimator. The DAC includes a digital input, an analog output and a sampling input. The sampling input is responsive to a sampling signal to control sampling intervals for digital samples at the digital input. The variable decimator effects for each successive set of N digital samples an optimum decimation thereof into M corresponding digital samples with M less than N and with at least one optimum decimation including non-uniform time intervals between selected samples thereof The variable decimator further delivers at least the corresponding M digital samples of each optimum decimation to the digital input of the DAC together with a sampling signal. The sampling signal includes timing information for the M digital samples within the corresponding set of N digital samples.

In an alternate embodiment of the invention a method for a DAC is disclosed which comprises:

sampling the digital signal to obtain a first set of N digital samples thereof, generating a plurality of test decimations of the first set with each of the plurality of test decimations including M digital samples with M less than N and with selected ones of the plurality of test decimations exhibiting varying timing intervals between the corresponding M digital samples;

selecting an optimal one of the plurality of test decimations;

converting the optimal one of the plurality of test decimations to an analog signal with timing thereof corresponding with timing information for the M digital samples of the optimal one of the plurality of test decimations within the first set of N digital samples; and repeating the sampling, generating selecting and converting acts for successive sets of N digital samples.

BRIEF DESCRIPTION OF THE DRAWINGS

These and other features and advantages of the present invention will become more apparent to those skilled in the art from the following detailed description in conjunction with the appended drawings in which:

FIG. 3A is a signal diagrams showing a set of "N" samples of a digital input stream and a test decimation thereof FIG. 3B shows the timing information for the test decimation shown in FIG. 3A.

DETAILED DESCRIPTION OF THE EMBODIMENTS

An apparatus and method is disclosed for a digital-to-analog converter (DAC) system with both uniform and non-uniform sampling rates. The system includes a digital portion in which samples of a set of "N" digital samples are obtained from a digital input stream. Each set of samples is evaluated with various test decimations which may include various combinations of uniform and non-uniform timing intervals between the selected members of each decimation. Each test decimation includes substantially the same number "M" of digital samples where "M" is less than the number of samples "N" in each sample set. Each test decimation is digitally evaluated to determine which is the optimum test decimation. The optimum test decimation exhibits the best fit with the original set of "N" samples using a reduced set of "M" digital samples. This optimum test decimation along with the appropriate timing information is subject to an digital-to-analog conversion, with the corresponding analog output signal retaining a high degree of fidelity with the digital input signal albeit at a reduced average sampling rate. The reduction in sampling rate for the DAC simplifies circuit design and reduces power requirements.

Figure 1:
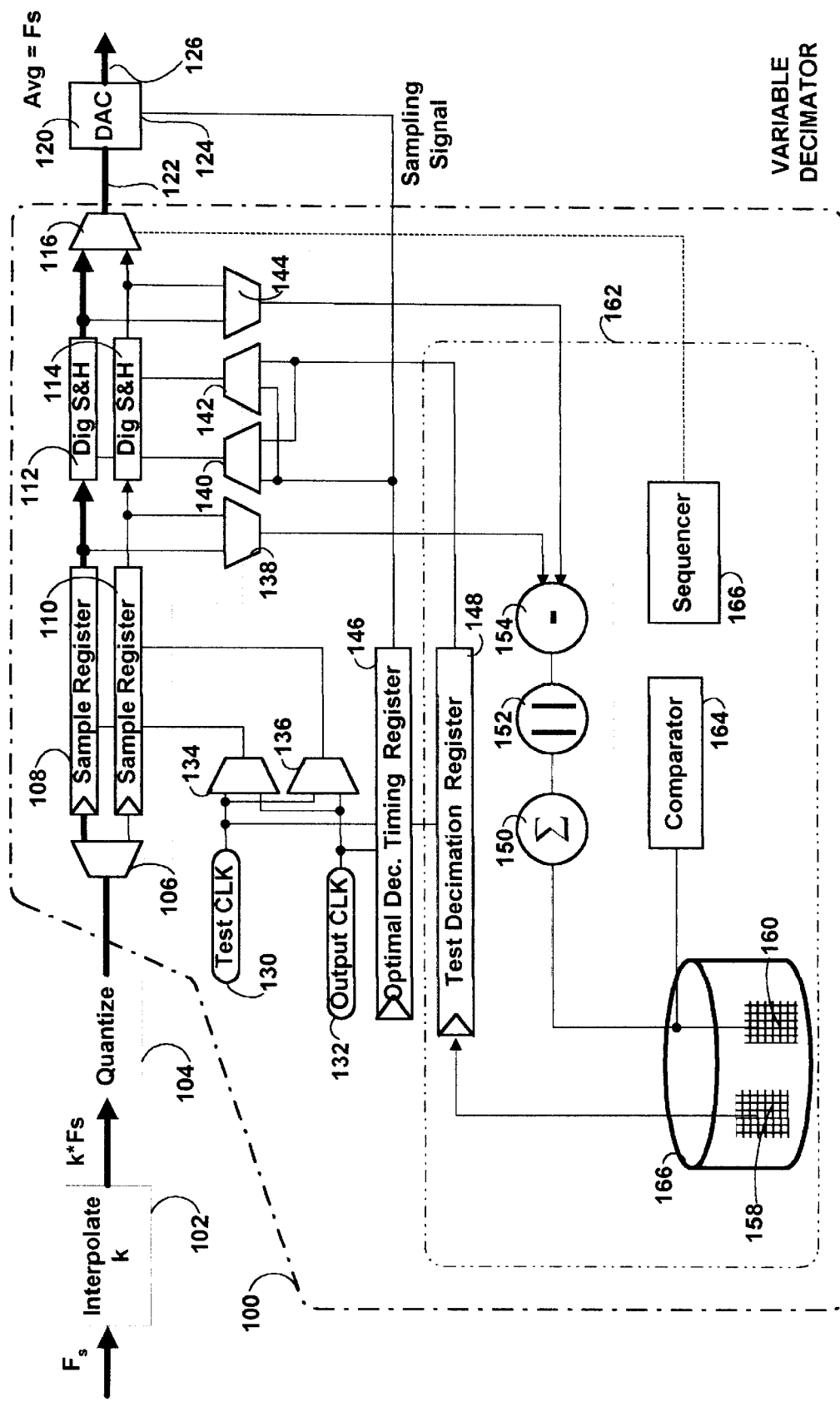
FIG. 1 is a hardware block diagram of a digital-to-analog converter (DAC) system in accordance with the current invention.

FIG. 1 is a hardware block diagram of a digital-to-analog converter (DAC) system in accordance with the current invention. With the steady increase in integration of digital electronics, it is often possible to trade off increased digital complexity for decreased analog complexity/power. The embodiment of the invention shown in FIG. 1 inserts into a digital stage consisting of an interpolator 102 and a quantizer 104 a variable decimator for decimating successive samples of the digital input stream. The variable decimation is effected at both non-uniform and uniform time intervals in the same and/or successive samples. Decimation is not fixed for each sample, instead a number of decimation tests are performed with different decimation "vectors" to determine which provides a best fit with the high resolution digital signal at the input of the decimator. Once a best fit decimation pattern is determined the appropriate digital samples are applied at the input to the DAC and the timing of the sampling of those samples is set to coincide with the time intervals at which the optimum decimation for that set was performed.

The DAC system includes the interpolator 102, the quantizer, 104, the variable decimator 100 and the DAC 120. The interpolator accepts input of a digital input signal and interpolates the digital samples increasing the number of samples by a factor "k". The quantizer 104 rounds off or truncates the samples at a given bit precision. The output of the quantizer is supplied as an input to the variable decimator 100, and specifically to a sampler portion thereof including a demultiplexer 106 the output of which couples with two memory elements in this case sample shift registers 108 and 110. These sample registers take successive sets of "N" samples of the digital input stream and operate on them in a "Ping-Pong" arrangement by virtue of switching there between provided by input demultiplexer 106. While one set of samples is being evaluated to determine the appropriate optimal decimation thereof the other register couples with the input port 122 of the DAC via the associated one of the digital sample and hold devices 112–114 and the output multiplexer 116. Through this output pathway at least the decimated portion of the sample register for which decimation evaluation has been completed is output to the DAC. The DAC controls the sampling and analog conversion of the digital input stream using a sampling signal applied to its sampling control input 124. An analog signal with a reduced signal rate is provided at the output 126 of the DAC.

The DAC sampling input is driven by the contents of the optimal decimation timing register 146 which is incremented the output clock 132. The output clock also couples via multiplexers 134–136 to whichever of the sample registers 108–110 is coupled to provide input to the DAC. The register 146 contains the timing information for the optimal decimation of the set of "N" samples in whichever of sample register 108–110 has completed evaluation and is coupled to the DAC. The optimal decimation is determined by the evaluator 162 for the associated set of "N" digital samples. In the example shown the contents of sample register 108 couple to the DAC via the digital sample and hold 112 and multiplexer 116. The timing information shifted out of the register 146 comprises binary "1"s and "0"s with the "1"s corresponding to intervals at which decimation is performed and the "0"s indicating samples in the original set of "N" digital samples which are not sampled by the DAC. The sequence of binary bits output by the register 146 comprises a sampling signal and is coupled to the DAC to control the sampling intervals thereof and also to the digital sample and hold in the output path, e.g. digital sample and hold 112. This sample and hold driven by the sampling signal samples the outputs of the sample register only on those increments of the output clock in which the sampling signal from register 146 contains a binary "1". The samples not used are discarded. Thus the digital input to the DAC comprises a digital signal the sampling frequency of which is reduced as compared with the output clock. The amount of reduction will correspond with the fractional relationship "M/N" where M is the number of sampled in the decimation of the sample register of "N" digital samples.

The sample register 108–110 which is not coupled to the DAC is coupled to the evaluator and sub portions thereof for the generation and evaluation of test decimation vectors and the selection of an optimum decimation vector. Once the optimum decimation vector for the "offline" one of the sample registers, e.g. register 110, is chosen that sample register is ready to go back "online" coupling to the DAC. The optimum decimation vector is loaded into the optimal decimation timing register 146 and the sample signal generated thereby is used to inject the next set of "M" samples onto the analog output of the DAC.

The evaluator comprises a test decimation shift register, a memory 166, a sequencer, a comparator and a set of functions 154, 152 and 150. The memory 166 contains a set of test decimation vectors 158 which are sequentially uploaded into the test decimation register via the sequencer 166. The sequencer controls all the Ping-Pong pathways within the variable decimator.

Evaluation comprises the following acts. First a set of "N" samples is loaded into the appropriate one of the sample registers, e.g. register 110. Next a first of the possible decimation vectors 158 is loaded into the test decimation register from memory 166. Next the test decimation register and the selected sample register are coupled to the test clock 130 either directly or via multiplexers 134–136. The selected digital sample and hold, e.g. sample and hold 114 is coupled to the output of the test decimation register 148. As the test clock increments contents out of the sample register, e.g. register 110 the multiplexer 138 couples the resultant digital signal to one of the two inputs of subtractor 154. The other input to the subtractor is delivered by multiplexer 144 from the output of the corresponding sample and hold device, e.g. 114. The subtractor obtains the difference on each clock interval of the test clock between these two inputs to the subtractor (See FIGS. 3A,C). The absolute value of the difference or the square of the absolute value is determined in function 152 and the results across the test decimation vector are accumulated in integrator 150. Once the entire sample in the associated sample register, e.g. register 108, has been evaluated the results are stored in test result table

160. This process continues with each test decimation vector evaluated and stored in table 160. At the end of the evaluation the comparator 164 determines which of the decimation vectors results in a best fit or minimum error with respect to the high resolution sample contained in the sample register being evaluated. Then when the other sample register has finished driving the DAC the new optimal decimation vector is loaded from table 160 into the optimal decimation timing register and the ping-pong operation is reversed. This process continues with evaluation of successive digital samples. The samples may in an embodiment of the invention overlap with one another. The samples not used are discarded.

Figure 2:
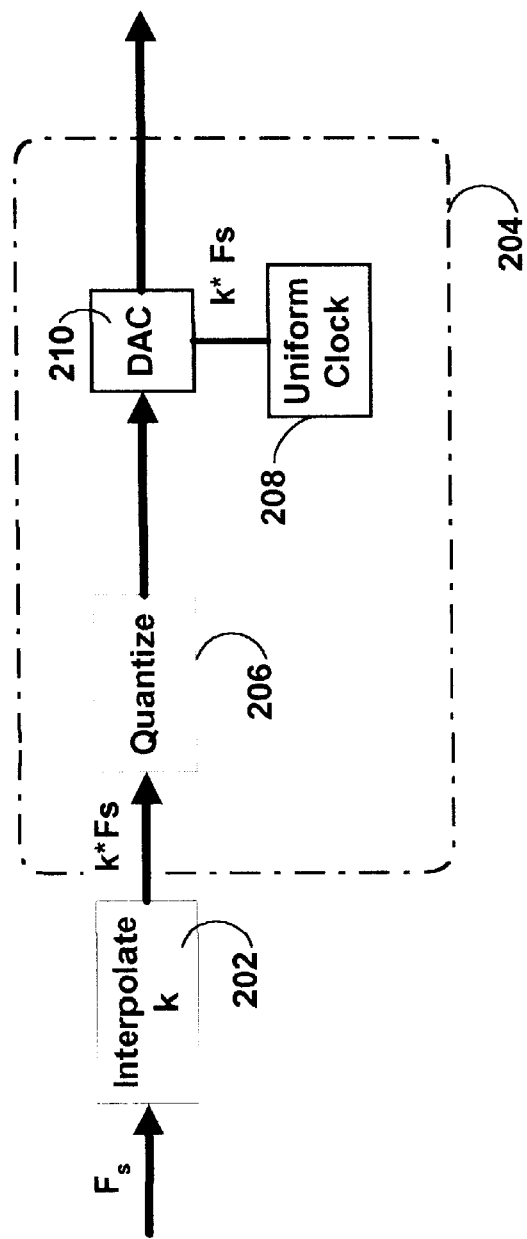
FIG. 2 is a hardware block diagram of a Prior Art DAC design.

FIG. 2 is a hardware block diagram of a Prior Art DAC design. The DAC system includes an interpolator 202, a quantizer 206, and a DAC 210. The DAC sampling frequency is driven by a fixed clock 208, at a sampling rate of k×Fs where k is the interpolation factor. This prior art DAC requires therefore higher power consumption than the DAC of the current invention shown in FIG. 1 which runs at an average clock rate corresponding with the fraction "M/N× k×Fs," where N is the number of samples in each sample set and M is the number of samples remaining after decimation.

FIG. 3 A is a signal diagrams showing a set of "N" samples of a digital input stream and a test decimation thereof A desired analog output waveform 300 is shown across one sample interval 322 and a portion of a prior interval. The sampling interval t=1 extends from $t_n$ to $t_{n+1}$. Superimposed on the analog waveform are "N" digital samples 302 which corresponds with the inputs to the variable decimator 100 shown in FIG. 1. The digital samples include the five samples 312–320 which were part of the input to the interpolator 102 (See FIG. 1) as well as additional fifteen samples added by interpolation and represented with an "X". Thus there "N=20" digital samples in the sample set. In the example shown the decimation test vector comprises "M=5" samples, the selection of which is represented by decimated sample signal 304. The test decimation sample signal 304 with "M" samples has a very poor fit with the "N" original and interpolated samples. The fit is quantified by the evaluator 162 discussed above in connection with FIG. 1. In the embodiment shown decimation is performed by selecting one digital sample, either original or interpolated, in each interval t=0.2 of the original digital input signal. A carryover is allowed into the next interval. The carryover 306 from the last interval 310–312 from the prior set of "N" samples is shown.

FIG. 3B shows the associated timing information for the test decimation shown in FIG. 3A. The sequence of binary "1"s and "0"s is shown with the "1"s corresponding to times during the sample interval 322 at which the decimation samples are obtained from either the original or interpolated digital sample values.

Figures 3C, 3D:
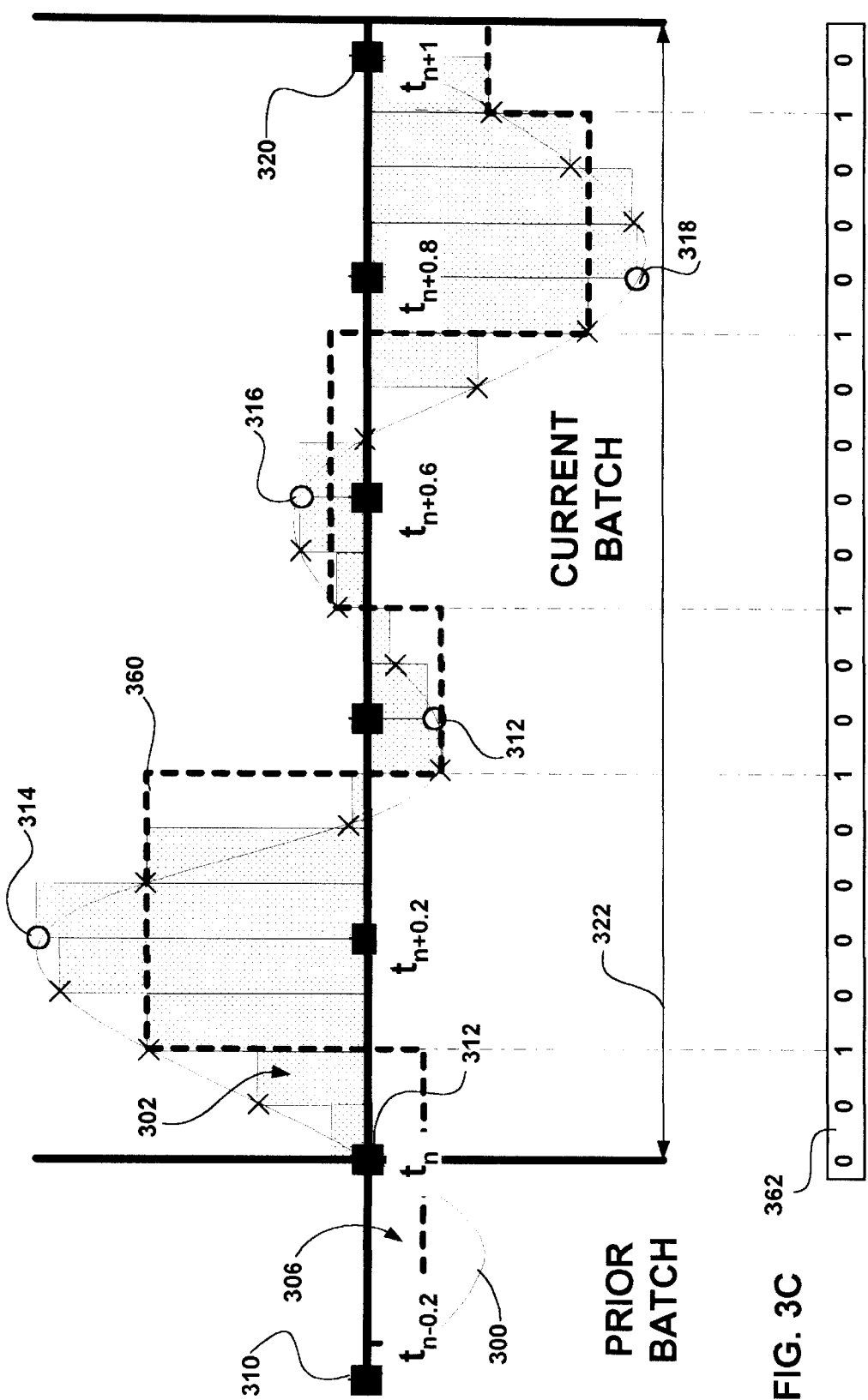
FIG. 3C is a signal diagram showing the same set of "N" samples of the digital input stream as shown in FIG. 3A with a different test decimation thereof.
FIG. 3D shows the timing information for the test decimation shown in FIG. 3C.

FIG. 3C is a signal diagram showing the same set of "N" samples of the digital input stream as shown in FIG. 3A with a different test decimation 360 thereof There is a much improved fit between the test decimation sample signal 360 which has "M" samples with the "N" original and interpolated samples. The fit is quantified by the evaluator 162 discussed above in connection with FIG. 1.

FIG. 3D shows the timing information 362 for the test decimation 360 shown in FIG. 3C. If the test decimation is the optimal decimation as determined by the evaluator 162 (See FIG. 1) then the timing information 362 is loaded into the optimal decimation timing register 146 during the output of the corresponding sample set to the DAC 120 (See FIG. 1).

Figure 4:
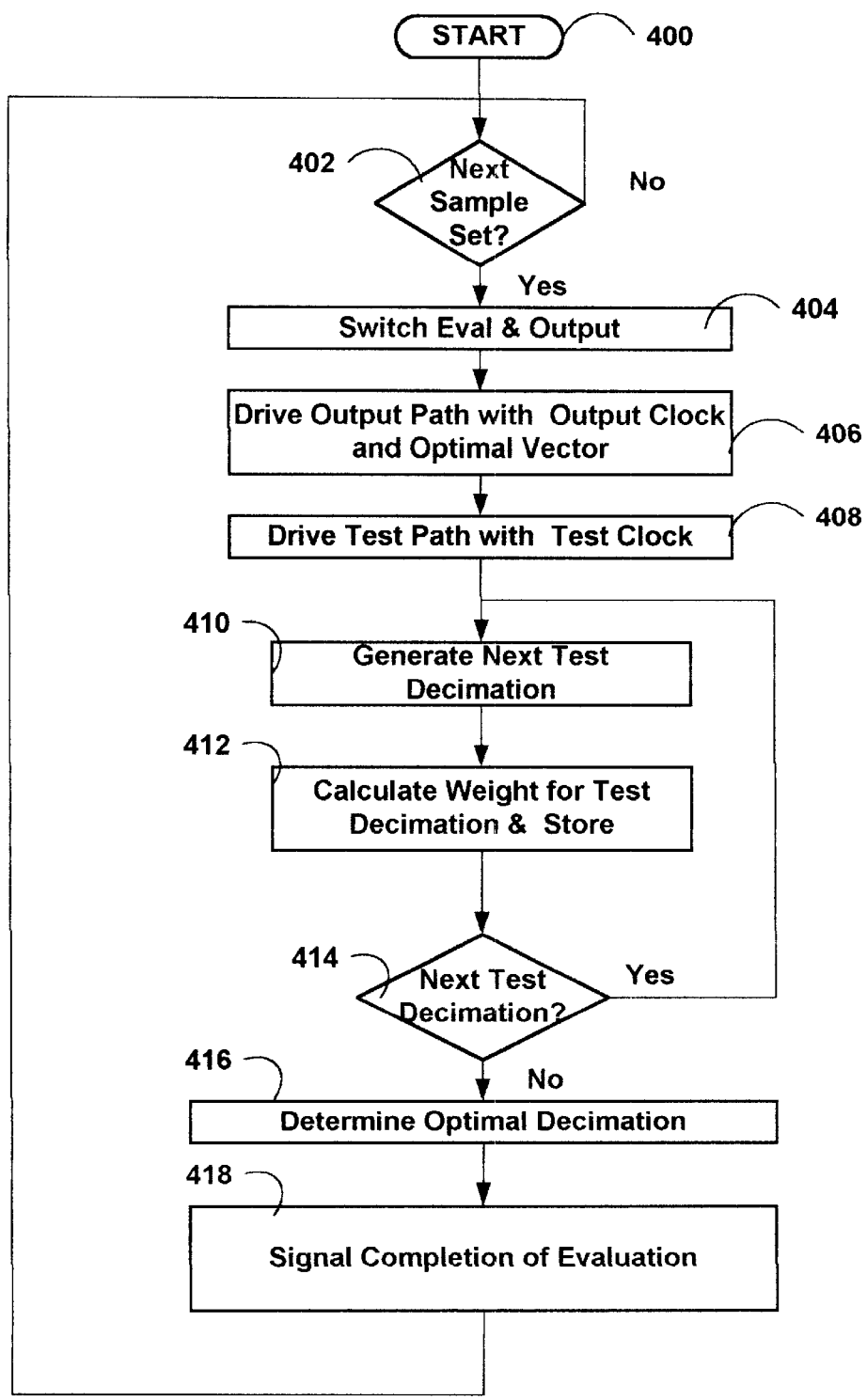
FIG. 4 is a process flow diagram of the operation of the DAC system shown in FIG. 1.

FIG. 4 is a process flow diagram of the operation of the DAC system shown in FIG. 1. Processing begins at start block 400 in which the system is initialized. Control then passes to decision process 402 in which the next sample set of "N" samples is obtained. Then in process 404 the one of the sample registers 108–110 (See FIG. 1) which was serving as the register for feeding the evaluator 162 and the other of the registers serving as the output register to the DAC are reversed. Next in process 406 the output clock 132 (See FIG. 1) is used to drive the corresponding sample register 108–110 and the optimal decimation timing information is loaded into the optimal decimation timing register 146 and used to drive the associated one of the digital sample and holds 112–114 and the sample input 124 of the DAC (See FIG. 1). Next in process 408 the components on the test or evaluation path are driven with the test lock. Unless parallel circuits are provided the test clock will run at a significantly higher rate than the output clock in order that all the test decimation vectors 158 (See FIG. 1) can be evaluated while the other sample register is coupled to the DAC.

Next in process 410 the next test decimation vector is loaded from table 158 to the test decimation register 148. Next in process 412 the difference in the fit of the decimation signal, e.g. signals 304 and 360 (See FIGS. 3A,C) and the set of "N" samples is determined. The score, weight, or difference associated with each tested decimation vector is stored in the result table 160. If more vectors remain to be evaluated control returns to process 410. Otherwise control passes to process 416 for a determination of the optimal decimation vector. This is determined by comparator 164 performing a search through the table 160. Then in process 418 with the optimal vector identified control passes to process 418. In process 418 the sequencer 166 is signaled by the comparator 164 to indicate that evaluation is complete and control returns to decision process 402 in which the next sample is obtained and evaluated and the previous sample is output with the optimal decimation to the DAC.

In alternate embodiments of the invention the input to the DAC may comprise the entire set of "N" samples with the sample signal to the DAC determining when sampling occurs and thus which of the "N" samples are discarded.

In an alternate embodiments of the invention the above mentioned methods and apparatus may be implemented in hardware, software or firmware. The switching provided by the multiplexers may be accomplished by numerous other devices including a processor with access to various memory locations for the storage of the alternating sample sets or decimation values. In lieu of alternate sample registers or memory locations a single delay buffer may be utilized with similar result.

The foregoing description of a preferred embodiment of the invention has been presented for purposes of illustration and description. It is not intended to be exhaustive or to limit the invention to the precise forms disclosed. Obviously many modifications and variations will be apparent to practitioners skilled in this art. It is intended that the scope of the invention be defined by the following claims and their equivalents.

What is claimed is:

1. An digital-to-analog converter (DAC) system for converting a digital signal to a converted analog signal, said DAC system comprising:

a DAC with a digital input, an analog output and a sampling input responsive to a sampling signal to control sampling intervals for digital samples at the digital input;

a variable decimator to effect for each successive set of N digital samples an optimum decimation thereof into M corresponding digital samples with M less than N and with at least one optimum decimation including non-uniform time intervals between selected samples thereof; and the variable decimator further to deliver at least the corresponding M. digital samples of each optimum decimation to the digital input of said DAC together with a sampling signal with timing information for the M digital samples within the corresponding set of N digital samples.

2. The DAC system of claim 1, wherein said variable decimator further comprises: a sampler to sample each successive set of N digital samples of the digital stream; and an evaluator to evaluate each successive set of N digital samples with corresponding subsets of M digital samples and to select from each of the corresponding subsets a selected subset corresponding with the optimum decimation of the corresponding set of N digital samples, and to output the sampling signal corresponding to the timing intervals between each of the M digital samples of the selected subset within the corresponding set of N digital samples.

3. The DAC system of claim 2, wherein the optimum decimation evaluated by the evaluator minimizes a difference with the corresponding successive set of N digital samples over substantially corresponding time intervals.

4. The DAC system of claim 1, wherein the at least corresponding M digital samples delivered to the input of said DAC by the variable decimator each include remaining ones of the corresponding successive set of N digital samples with the sampling signal determining which of the N digital samples of the corresponding successive set to input to the DAC.

5. The DAC system of claim 1, wherein the at least corresponding M digital samples delivered to the input of said DAC by the variable decimator each exclude remaining ones of the corresponding sets of N digital samples with the sampling signal determining the corresponding timing intervals for input of the at least M digital samples from each successive set of N digital samples to the DAC.

6. The DAC system of claim 1, wherein the DAC sampling intervals correspond with an average sampling rate substantially less than an input sampling rate of the digital signal.

7. The DAC system of claim 1, wherein each successive set of N digital samples overlap with one another.

8. A method for converting a digital signal to a converted analog signal, comprising:

sampling the digital signal to obtain a first set of N digital samples thereof;

generating a plurality of test decimations of the first set with each of the plurality of test decimations including M digital samples with M less than N and with selected ones of the plurality of test decimations exhibiting varying timing intervals between the corresponding M digital samples;

selecting an optimal one of the plurality of test decimations;

converting the optimal one of the plurality of test decimations to an analog signal with timing thereof corresponding with timing information for the M digital samples of the optimal one of the plurality of test decimations within the first set of N digital samples; and repeating the sampling, generating selecting and converting acts for successive sets of N digital samples.

9. The method for converting of claim 8, wherein said selecting act further comprises:

determining which among the plurality of test decimations minimizes a difference with the N digital samples of the first set.

10. The method for converting of claim 8, wherein the repeating act further comprises:

effecting a digital-to-analog conversion exhibiting an average sample rate fractionally related as M/N to an input sampling rate.

* * * * *